(12) United States Patent
Delhougne et al.

(10) Patent No.: US 10,825,868 B2
(45) Date of Patent: Nov. 3, 2020

(54) THREE-DIMENSIONAL SEMICONDUCTOR DEVICE AND METHOD OF FABRICATING SAME

(71) Applicant: IMEC vzw, Leuven (BE)

(72) Inventors: Romain Delhougne, Boortmeerbeek (BE); Davide Francesco Crotti, Leuven (BE); Gouri Sankar Kar, Leuven (BE); Luca Di Piazza, Wezembeek-Oppem (BE); Ludovic Goux, Hannut (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/234,381

(22) Filed: Dec. 27, 2018

(65) Prior Publication Data

US 2019/0221610 A1    Jul. 18, 2019

(30) Foreign Application Priority Data

Dec. 29, 2017  (EP) .................................... 17211025

(51) Int. Cl.
| | |
|---|---|
| *H01L 27/24* | (2006.01) |
| *H01L 27/11597* | (2017.01) |
| *H01L 45/00* | (2006.01) |

(52) U.S. Cl.
CPC ...... *H01L 27/249* (2013.01); *H01L 27/11597* (2013.01); *H01L 27/2409* (2013.01); *H01L 27/2427* (2013.01); *H01L 45/06* (2013.01); *H01L 45/08* (2013.01); *H01L 45/1233* (2013.01); *H01L 45/1253* (2013.01); *H01L 45/1683* (2013.01)

(58) Field of Classification Search
CPC ............ H01L 27/249; H01L 27/11597; H01L 27/2409; H01L 27/2427; H01L 45/06
See application file for complete search history.

(56) References Cited

U.S. PATENT DOCUMENTS

| | | |
|---|---|---|
| 8,076,198 B2 | 12/2011 | Lee et al. |
| 2011/0210301 A1 | 9/2011 | Nansei |
| 2011/0297912 A1 | 12/2011 | Samachisa et al. |
| 2013/0043455 A1 | 2/2013 | Bateman |

(Continued)

OTHER PUBLICATIONS

Extended European Search Report dated Jul. 6, 2018 for European Patent Application No. 17211025.6, in 8 pages.

*Primary Examiner* — Changhyun Yi
(74) *Attorney, Agent, or Firm* — Knobbe, Martens, Olson & Bear, LLP

(57) ABSTRACT

In one aspect, a method for manufacturing a three-dimensional (3D) semiconductor device is disclosed. It includes providing a vertical stack of alternating layers of a first layer type and a second layer type, and providing a first trench and a second trench adjacent the vertical stack. The first trench and the second trench can define a fin. The method further can include recessing the first layer type to form recesses extending into the fin, providing a first electrode in individual ones of the recesses, and providing a second electrode in the first trench and the second trench. The method further can include providing, for individual ones of the recesses, a lateral stack including a memory element, a middle electrode, and a selector element. The lateral stack can extend between the first electrode and the second electrode, thereby forming a memory device.

20 Claims, 10 Drawing Sheets

(56) References Cited

U.S. PATENT DOCUMENTS

| | | | |
|---|---|---|---|
| 2014/0217349 A1* | 8/2014 | Hopkins | H01L 45/06 257/4 |
| 2014/0361239 A1 | 12/2014 | Ramaswamy et al. | |
| 2015/0340406 A1 | 11/2015 | Jo | |
| 2016/0043143 A1 | 2/2016 | Sakotsubo | |
| 2016/0181271 A1* | 6/2016 | Yada | H01L 27/11582 438/264 |

* cited by examiner

THREE-DIMENSIONAL SEMICONDUCTOR DEVICE AND METHOD OF FABRICATING SAME

CROSS-REFERENCE TO RELATED APPLICATIONS

This application claims foreign priority to European Patent Application No. 17211025.6, filed Dec. 29, 2017, the content of which is incorporated by reference herein in its entirety.

BACKGROUND

Field

The disclosed technology generally relates to semiconductor devices, and more specifically to three-dimensional semiconductor memory devices and methods of manufacturing semiconductor memory devices.

Description of the Related Technology

Increasing consumer demands for electronic products that offer superior performance and/or lower cost in turn demands more highly integrated semiconductor devices. Storage class memory (SCM) technology has the potential to bridge the gap between dynamic random-access memory (DRAM) and flash memory technologies, e.g., due to faster operation speed compared to flash memory, and lower bit cost compared to DRAM.

The relatively high cost per bit of two-dimensional (2D) integrated memories may not be compatible with the exponential increase of memory bits in future SCM applications. To overcome such challenges, three-dimensional (3D) semiconductor memory devices having three-dimensionally or vertically arranged memory cells have been recently proposed, but are still having some challenges for SCM applications. To date, 2D stacked SCM architectures have been developed, but are facing cost issues for stacks comprising more than, e.g., four layers.

Thus, there is a need for improved 3D semiconductor memory devices.

SUMMARY OF CERTAIN INVENTIVE ASPECTS

An objective of the disclosed technology is to provide improved 3D semiconductor devices, such as 3D storage class memory (SCM) devices, and methods of manufacturing the same.

According to an aspect of the disclosed technology, a method of manufacturing a semiconductor device comprises providing a vertical stack of alternating layers of a first layer type and a second layer type, and forming a first trench and a second trench in the vertical stack, wherein the first trench and the second trench define a fin. The method further comprises recessing, from the first trench and from the second trench, the first layer type to form recesses extending into the fin, and providing a first electrode in each recess and providing a second electrode in each one of the first trench and the second trench. The method further comprises providing, for each recess, a lateral stack comprising a memory element, a middle electrode, and a selector element, wherein the lateral stack extends between the first electrode and the second electrode, thereby forming a memory device.

As used herein, reference to "each" of a particular element (e.g., "each recess") may refer to two or more of the elements, and may or may not refer to every one of the elements in the device. For example, "each recess" may refer to individual ones of a plurality of recesses and not necessarily every single recess in the device.

A present aspect can employ a plurality of replacement processes of fabricating the memory cell structure. These replacement processes can have the benefit of being performed directly from the trench defining the fin structure, instead of using additional trenches or slits dedicated solely for this purpose. The possibility to form the memory cells directly from the trenches may improve the scalability by reducing the footprint of the device, and also reducing the number of process steps. The memory cell structure may, e.g., be a 1S1R cell, comprising one selector element and one resistor element.

Certain implementations of the disclosed manufacturing process can reduce the bit cost for manufacturing high density memories and can be compatible with various selector and memory technologies, such as, e.g., an ovonic threshold switching (OTS) device, volatile conductive bridge (VCB), Mott-based, diodes for selectors, and oxide-based resistive random access memory (OxRAM), conductive-bridging random access memory CBRAM), phase-change memory (PCM), and ferroelectric random access memory (FeRAM) based memory cells. The manufacturing process in some embodiments can further allow for the manufacturing order of the memory element and the selector element to be interchanged, which may allow for improved device operation, compatibility, and simplified process flow.

As used herein, a vertical stack may be understood as a structure comprising at least two layers arranged on top of each other, as seen in a vertical direction relative an underlying semiconductor substrate.

As used herein, a lateral stack may refer to at least two layers arranged beside each other, in a lateral or horizontal direction.

As used herein, a stack of alternating layers of a first layer type and a second layer type may generally refer to a structure in which every other layer may be of a first type (such as a first type of material) and every other layer may be of a second type (such as a second type of material).

As used herein, recessing may refer to a material removal process resulting in concavity or space extending e.g., into a vertical stack of alternating layers, or in a lateral stack of layers. This may, for example, include removing parts of a layer of the first layer type, while leaving adjacent layers of the second layer type intact, or vice versa. Recessing may, for example, be done by an etching process.

In some embodiments, forming of the first and/or second trench could be referred to as recessing the layers such that trenches are formed.

Although various examples are described as involving a recessing process, it will be appreciated that various embodiments may involve an additive process without a subsequent removal process, e.g., providing a material based on the desired thickness to be formed.

As used herein, a selector element may refer to an element that tends to conduct current above certain voltage levels. A selector element may, e.g., include an OTS device, a mixed ionic-electronic conduction (MIEC) element, and/or a diode.

It will be appreciated that a memory device or cell, as used in the context of the disclosed technology, may generally refer to the specific memory structure capable of storing two different logic states, such as a logic "1" and a logic "0". As used herein, a semiconductor device or semiconductor memory device may generally refer to the resulting 3D device, comprising a plurality of individual cells (or memory devices).

According to an embodiment, the step of providing the first electrode may comprise filling each recess with a first conductive material and recessing at least some of the first conductive material back into the recess. In this embodiment, the first conductive material may be recessed (e.g., at least partly removed or etched back) into the fin structure until a desired thickness is left at the "bottom" of the recess (e.g., as seen from the trench). The thickness, or amount of material forming the first electrode may thus be determined by the recessing process. This first electrode may form the word line (WL) in the resulting semiconductor device. A suitable material for the first electrode may, for example, include titanium nitride/tungsten (TiN/W) to provide a relatively low electrical resistance.

According to an embodiment, the step of providing the lateral stack may comprise forming the memory element by filling each recess with a memory element material and recessing at least some of the memory element material back into the recess. The memory element material may hence be provided in the recess in a similar manner as for the above-mentioned first electrode, e.g., by a replacement process. The memory element thus formed may, e.g., be a charge trapping device, of for example an OxRAM, PCM, CBRAM, or a ferroelectric element such as, e.g., a ferroelectric field-effect transistor (FeFET). Ferroelectric material may reduce power consumption of the memory device and increase switching speed and scalability.

According to an embodiment, the step of providing the lateral stack may comprise forming the middle electrode by filling each recess with a second conductive material and recessing at least some of the second conductive material back into the recess in a similar manner as described above in connection with the first electrode. A suitable material for the middle electrode may be, for example, titanium nitride (TiN).

According to an embodiment, the step of providing the lateral stack may comprise forming the selector element by providing a selector element material in the first trench and the second trench. It will however be appreciated that the selector element may be arranged fully in the recess or at least partly in the recess and partly in the trench. The selector element material may alternatively be formed either before or after the formation of the memory layer. This can provide flexibility and can improve the process flow. Examples of selector element materials include, for example, chalcogenide material.

According to an embodiment, the step of providing the lateral stack may comprise lining each recess with a selector element material forming the selector element, filling each recess with a second conductive material forming the middle electrode, and forming the memory element by providing a memory element material in the first trench and the second trench. This embodiment provides an alternative method of manufacturing the lateral stack and may allow for a better thickness control of the selector element and improved performances. The order of the above steps may however be changed, resulting in switched positions of the memory element and the selector element. Thus, the step of providing the lateral stack may comprise lining each recess with the memory element material forming the memory element, followed by filling each recess with the second conductive material forming the middle electrode, and subsequently forming the selector element by providing a selector element material in the first trench and the second trench.

According to another embodiment, the first layer type may be a first electrically insulating material and the second layer type may be a second electrically insulating material. Thus, by recessing the first layer type into the fin in a manner that allows for a part of the first layer type material to remain between the recesses, two separated memory cells may be formed at each vertical level of the fin. This can be enabled by the remaining part of the first layer type acting as insulation between the first electrodes in each recess.

According to another embodiment, the method may further comprise providing, e.g., prior to forming the first and second trench, the vertical stack with a staircase structure configured to individually connect the first electrode in each recess. Thus, each first electrode of the fin may be individually accessible.

According to another embodiment, the method may further comprise patterning the second electrode material into a plurality of contact structures connecting the cells. In some embodiments, cells from different fins may be interconnected. The patterning may be understood as a process including a combination of lithography and etching so as to achieve contact structures configured to selectively contact specific cells of the fins.

According to another embodiment, the contact structures may be shaped as separated lines or dots configured to connect specific vertical stacks of cells to, e.g., a bit line. The contact structures may, e.g., be formed as separated lines extending over several fins, or as contacts dots configured to connect, e.g., one or two sets of cells arranged in vertical stacks.

According to another embodiment, the method may further comprise removing the selector element (or the memory element, in case the selector element and the memory element are interchanged) and/or the middle electrode material between the plurality of contact structures. Thus, the cells may be electrically separated, such that neighboring cells on a certain stack level may be individually addressed.

According to another embodiment, the method may further comprise connecting, via the staircase connection structure, the first electrode in each recess to a respective word line and connecting each one of the plurality of contact structures to a respective bit line. These connections can allow each memory cell, or 1S1R structure, to be individually addressed.

According to another aspect, a semiconductor device comprises a vertical stack of alternating layers of a first layer type and a second layer type and a fin defined by a first trench and a second trench in the vertical stack, wherein the layers of the first layer type comprise recesses (or memory devices or cells arranged in the recesses) extending laterally from the first trench and the second trench, respectively, into the fin. Each recess comprises a first electrode and each one of the first trench and the second trench comprises a second electrode. Each recess further comprises a lateral stack of a memory element, a middle electrode, and a selector element, the lateral stack being arranged to extend between the first electrode and the second electrode, thereby forming a memory device or memory cell.

This aspect may generally present the same or corresponding advantages as one or more of the former aspects. Thus, it is noted that the disclosed technology relates to all possible combinations of features recited in the claims, and that the various embodiments described for the methods according to any aspect are all combinable with embodiments of the devices according to any aspect. Further objectives of, features of, and advantages with the disclosed technology will become apparent when studying the following detailed disclosure, the drawings, and the appended claims. Those skilled in the art will realize that different features of the disclosed technology can be combined to create embodiments other than those described in the following.

BRIEF DESCRIPTION OF THE DRAWINGS

The above, as well as additional objects, features, and advantages of the disclosed technology, will be better understood through the following illustrative and non-limiting detailed description, with reference to the appended drawings. In the drawings, like reference numerals will be used for like elements unless stated otherwise.

As illustrated in the figures, the sizes of the elements, features, and other structures may be exaggerated or not depicted proportionally for illustrative purposes. Thus, the figures are provided to illustrate the general elements of the embodiments.

DETAILED DESCRIPTION OF CERTAIN ILLUSTRATIVE EMBODIMENTS

A manufacturing process of a 3D semiconductor device 10 will now be described with reference to FIGS. 1-13, which illustrate examples and embodiments of the disclosed technology.

Figure 1:
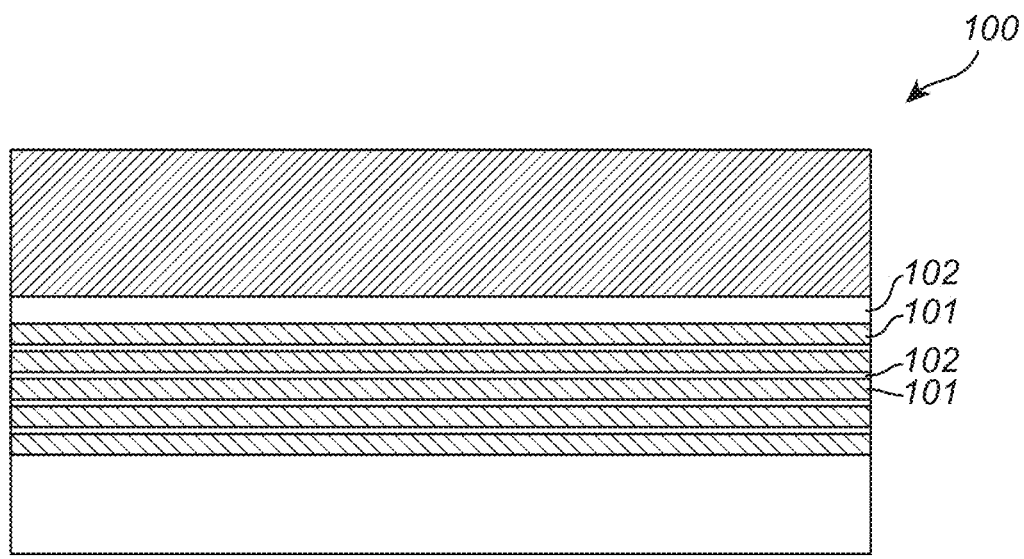
FIG. 1 illustrates a cross-sectional view of an intermediate structure as part of a method of manufacturing a three-dimensional (3D) semiconductor memory device according to some embodiments.

FIG. 1 illustrates a vertical stack 100 that may be provided by deposition of layers of a first 101 and a second type 102. Any suitable deposition process may be used, such as atomic layer deposition (ALD), chemical vapor deposition (CVD), physical vapor deposition (PVD), etc. The stack 100 may comprise multiple alternating layers, e.g., arranged such that every other layer may be of the first type 101 and every other layer of the second type 102. The material of the first layer type 101 and the second layer type 102 may be any suitable material allowing the layers 101, 102 to be removed selectively to each other, e.g., such that the first layer 101 is removed, and not the second layer 102, or vice versa, e.g., using an etching process. The first layer 101 may comprise a first electrically insulating material, such as, for example, a nitride. The second layer 102 may comprise a second electrically insulating material, such as, for example, an oxide.

Figure 2:
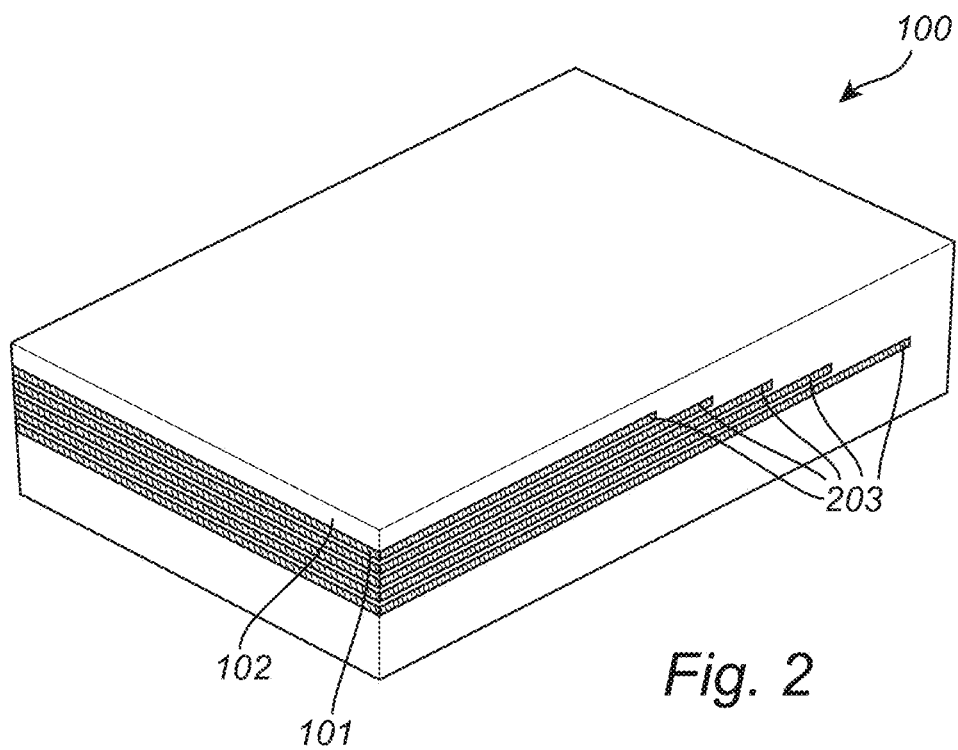
FIG. 2 illustrates a three-dimensional view of a part of a three-dimensional (3D) semiconductor memory device according to some embodiments.

In FIG. 2, a staircase connection structure 203 can be provided in the vertical stack 100. The staircase connection structure 203 may be formed by repeatedly patterning the layers 101, 102 of the vertical stack 100 such that each vertical level of the stack 100 may be is individually accessible or contacted from above (or below e.g., depending on the direction of the staircase connection structure 203). The staircase connection structure 203 may be arranged at the portion of the vertical stack 100 that may form an end portion of each of a plurality of fins. Thus, the staircase connection structure 203 can allow for each of the stack levels of the fins to be individually contacted.

Figure 3:
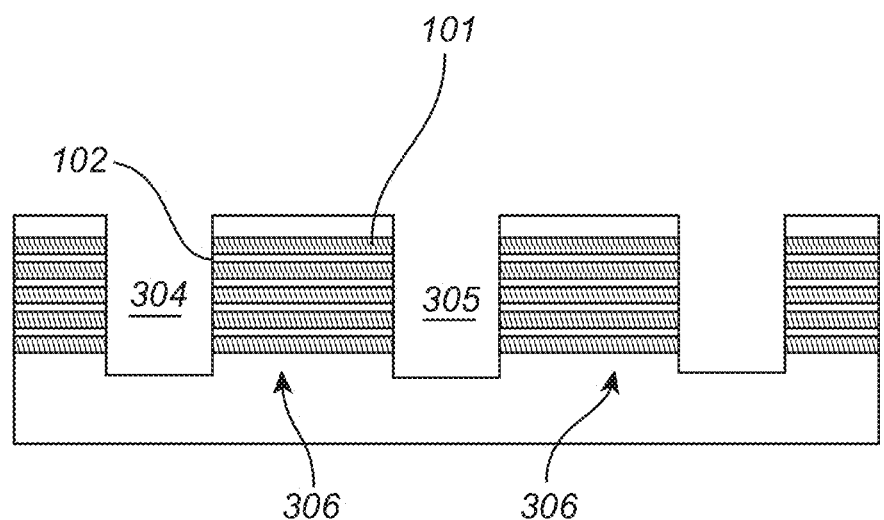
FIGS. 3, 4, 5a, 5b, 6a, 6b, 7a, 7b, 8, and 9 illustrate cross-sectional views of intermediate structures at different stages of a method of manufacturing a three-dimensional (3D) semiconductor memory device according to some embodiments.

In FIG. 3, trenches have been formed in the vertical stack 100 of alternating layers of the first layer type 101 and the second layer type 102. A first trench 304 and a second trench 305 may be formed in a parallel fashion, such that the remaining part of the stack 100 arranged between the trenches 304, 305 may define a fin 306. A non-limiting example of a cross-dimension depth of a trench 304, 305 may be around 90 nm.

In some embodiments, the trenches 304, 305 may be formed by recessing portions of the vertical stack 100. In some embodiments, instead providing a vertical stack 100 and subsequently recessing portions of the vertical stack 100, the layers 101, 102 of the vertical stack 100 may be provided such that trenches 304, 305 are adjacent to the vertical stack 100. For example, the layers 101, 102 of the vertical stack 100 may be deposited with the desired width. In some instances, the areas reserved for the trenches 304, 305 may be masked such that after the layers 101, 102 are deposited for the vertical stack 100, the trenches 304, 305 may be provided from the masked areas.

Figure 4:
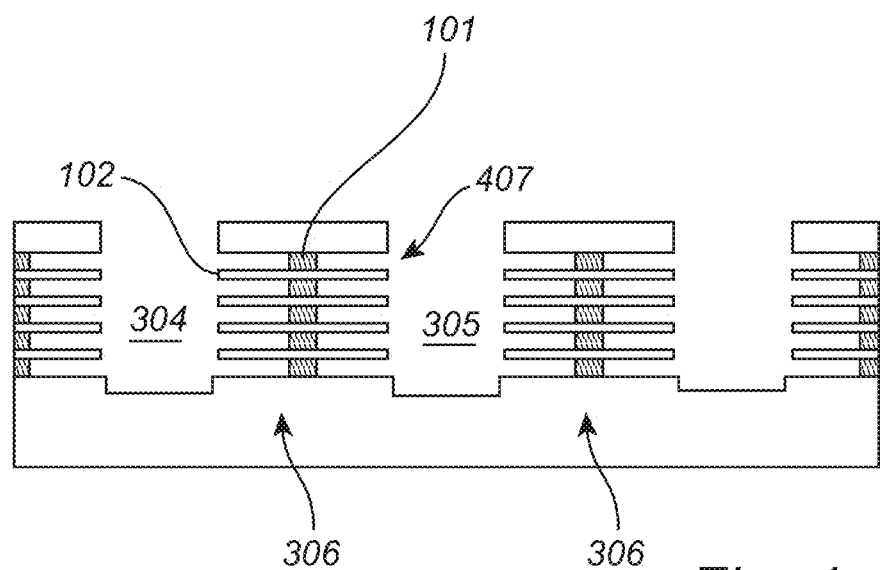

In FIG. 4 the first layer type 101 of the vertical stack 100 is recessed (e.g., partly etched) to form recesses 407 extending into the fin 306. In other words, the material of the first layer type 101 may be recessed from both sides of the fin 306 in a lateral direction into the fin 306. Thus, the material the first layer type 101 may be removed until some of the first layer type 101 remains, separating the recesses 407 arranged on the same vertical level of the stack 100. The resulting structure is illustrated in FIG. 4, wherein each level of the stack 100 comprises two recesses 407 that are separated by the remaining material of the first layer type 101 in the middle of the fin 306. In one non-limiting example, about 65 nm of the first layer type 101 may be selectively recessed (removed) by etching into the recess 407 and about 20 nm may remain of the first layer type 101 in the recess 407. This remaining part of the first layer type 101, which may include an electrically insulating layer, may serve as a supporting line and word line (WL) isolation between the lateral sides of the fin 306.

Figure 5A:
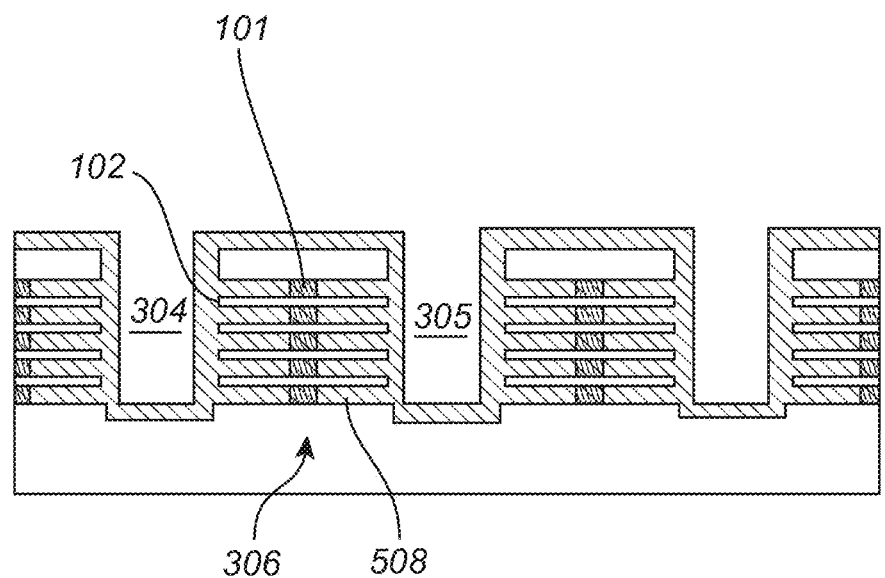
Figure 5B:
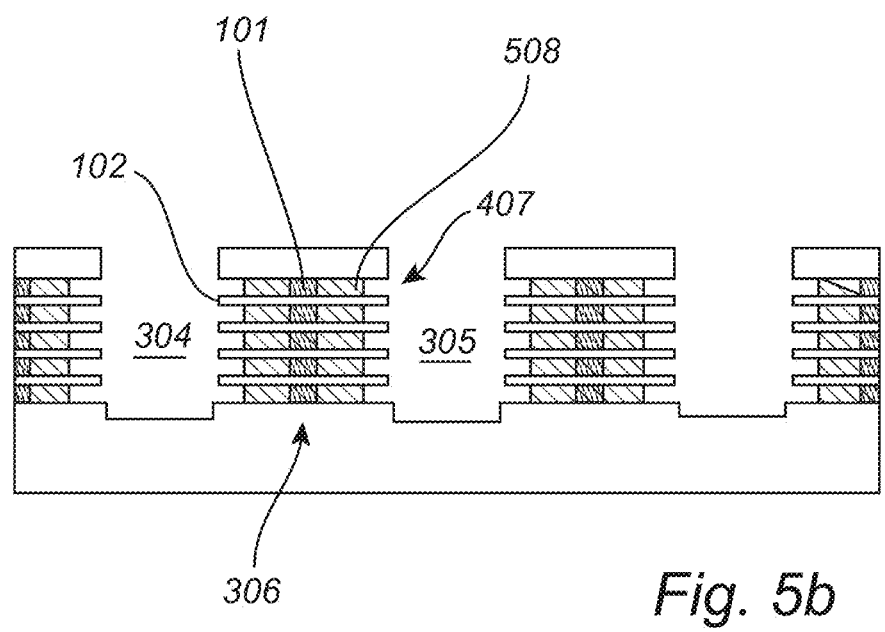

FIGS. 5a and 5b show the forming of a first electrode material of a lateral stack, resulting in a word line (WL). In FIG. 5a, the process of forming the first electrode 508 is performed by covering the fin and the trenches 304, 305 with a first conductive material 508. In some embodiments, one or more portions of the trenches 304, 305 may or may not be covered with the first electrode material 508. In some instances, the first electrode material 508 may be provided using a deposition process such as ALD. FIG. 5b shows the stack after the first conductive material 508 has been removed or etched away and at least partly recessed back into the recess 407 of fin 306. As illustrated in the present figure, the resulting structure may thus be a new recess 407 that extends into the fin and whose depth is defined by the first electrode material present at the "bottom" of the recess 407. This first conductive material forming the first electrode 508, and thus the WL, may be any suitable material such as, in a non-limiting example, a composition of titanium nitride/ tungsten (TiN/W), which can provide excellent WL conductivity properties. In some embodiments, the recessing may be performed by wet or dry etching with an etch rate that may be tightly controlled to provide a consistent WL resistance and WL width. In a non-limiting example, the remaining WL width may be about 40 nm by etching away about 25 nm of the WL. In some embodiments, the first electrode material 508 may be provided with the desired depth in the recess 407 (e.g., as shown in FIG. 5b) without a subsequent recessing process.

Figure 6A:
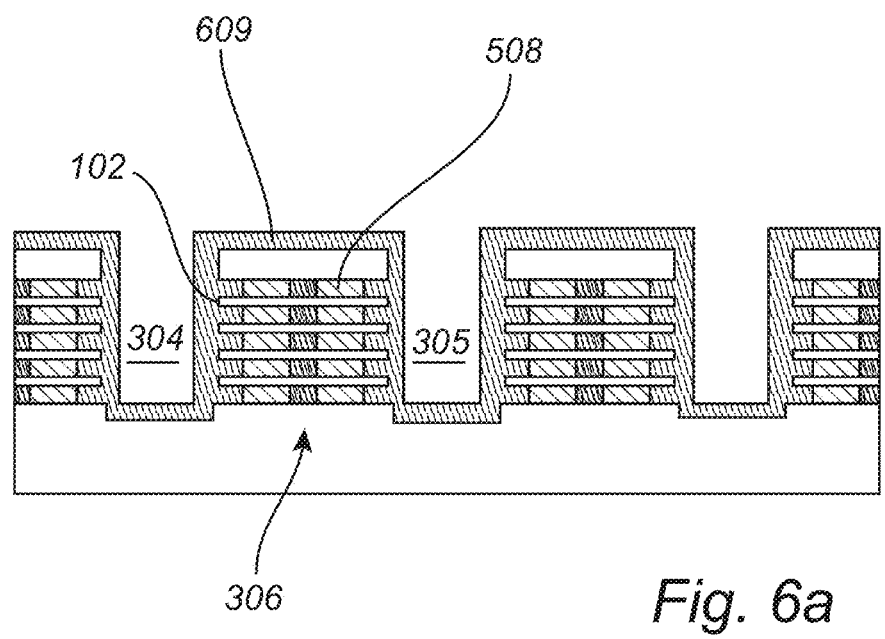
Figure 6B:
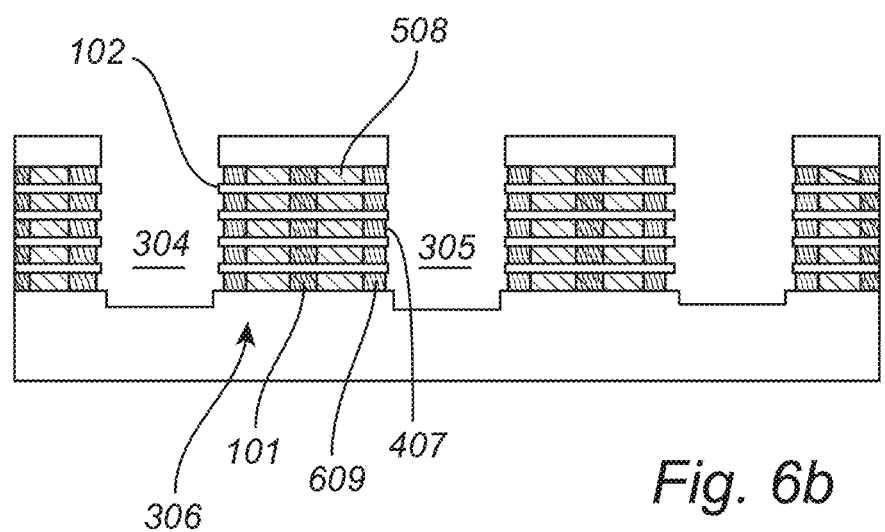

In FIGS. 6a and 6b, the memory element 609 is formed by filling each recess 407 with a memory element material 609. In this process, both the trenches 304, 305 and the fin may be covered by the memory element material 609. In some embodiments, one or more of portions of the trenches 304, 305 may or may not be covered with the memory element material 609. In FIG. 6b, the stack is shown after the memory element material 609 has been at least partly recessed back into the recess 407 of the lateral stack. Thus, it will be appreciated that the memory element 609 may be formed in a replacement process similar to the method employed when forming first electrode 508. In a non-limiting example, a width of about 20 nm of the memory element material may remain in the recess 407 of the lateral stack. This process of forming may be performed using a deposition process as, e.g., ALD, and using wet or dry etching with tight control of the etch rate, similar to the methods described above in connection with FIGS. 5a and b. In some embodiments, the memory element material 609 may be provided with the desired depth in the recess 407 (e.g., as shown in FIG. 6b) without a subsequent recessing process.

Figure 7A:
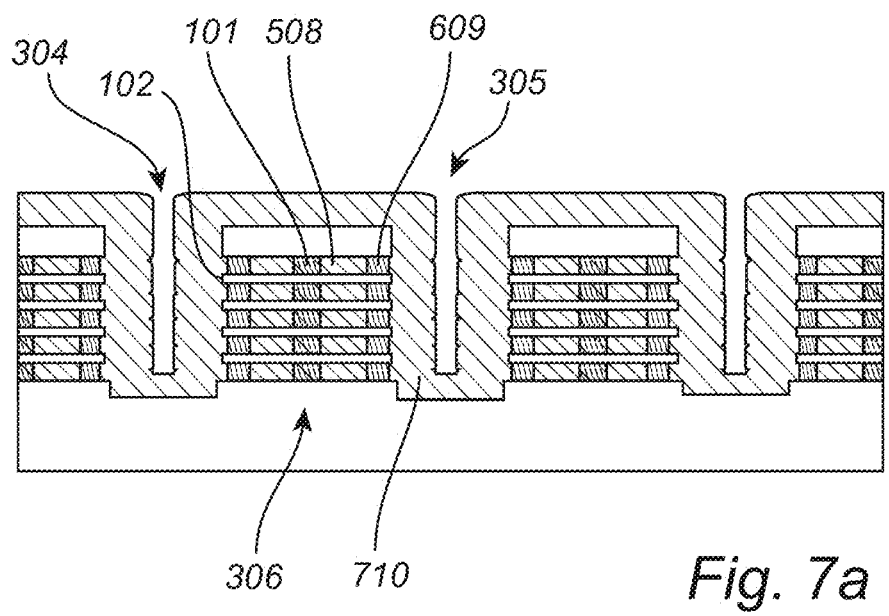
Figure 7B:
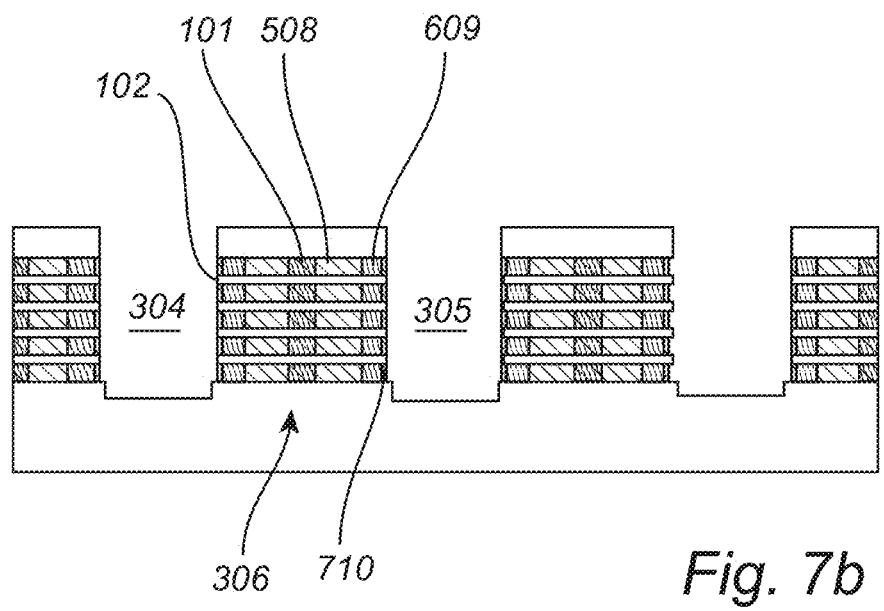

FIGS. 7a and 7b illustrate further steps of forming the middle electrode. The middle electrode 710 may be formed by covering both the fin 306 and the trenches 304, 305 with a second conductive material 710, as may be seen in FIG. 7a. In some embodiments, the second conductive material 710 may or may not cover one or more portions of the trenches 304, 305. In FIG. 7b, the stack is shown after the second conductive material 710 has been etched away and at least partly recessed back into the recess 407. In a non-limiting example, this second conductive material 710 may any suitable material as, e.g., titanium nitride (TiN) with a width of about 5 nm remaining in the recess 407 of the lateral stack. In some embodiments, the second conductive material 710 may be provided with the desired depth in the recess 407 (e.g., as shown in FIG. 7b) without a subsequent recessing process It will be noted that the above illustrated processes for providing the first electrode 508, the memory element 609, and the middle electrode 710 are merely examples for illustrating the disclosed technology. In particular, the internal order of the steps may be switched, resulting in other lateral stack configurations than the one shown in the above figures.

Figure 8:
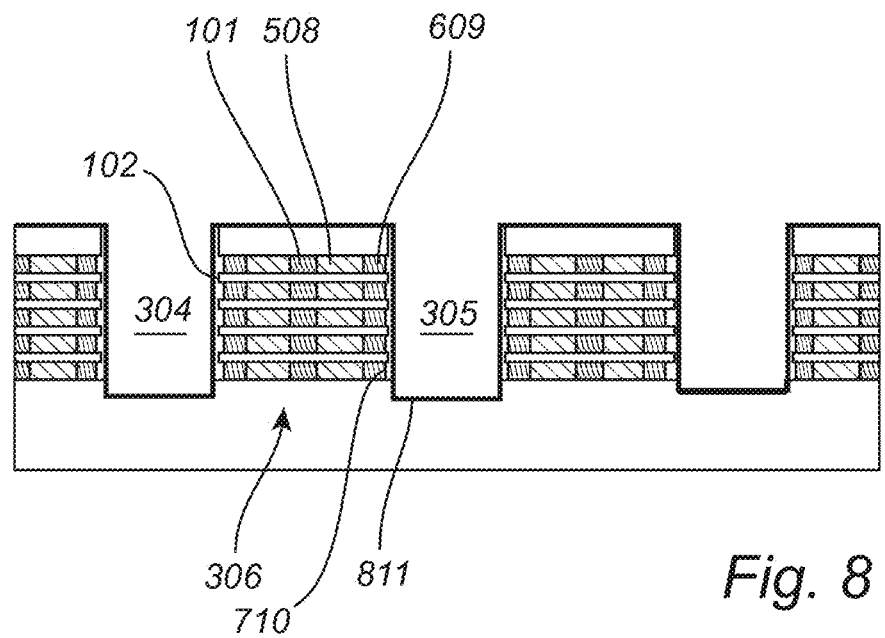

In FIG. 8, the selector element is formed. The selector element may be formed by providing a selector element material 811 in the trenches 304, 305. The selector element material 811 may be arranged to cover or line the walls of the trenches 304, 305, and may, in case there remain any recesses at the middle electrode 710, at least partly extend into the fin. The order of forming the selector element 811 and the memory element 609 in the lateral stack may be interchanged, which makes the manufacturing method compatible with different memory and selector technologies and may further improve the device operation and simplify the process flow. In a non-limiting example, the thickness of the selector material 811 may be about 5 nm.

Figure 9:
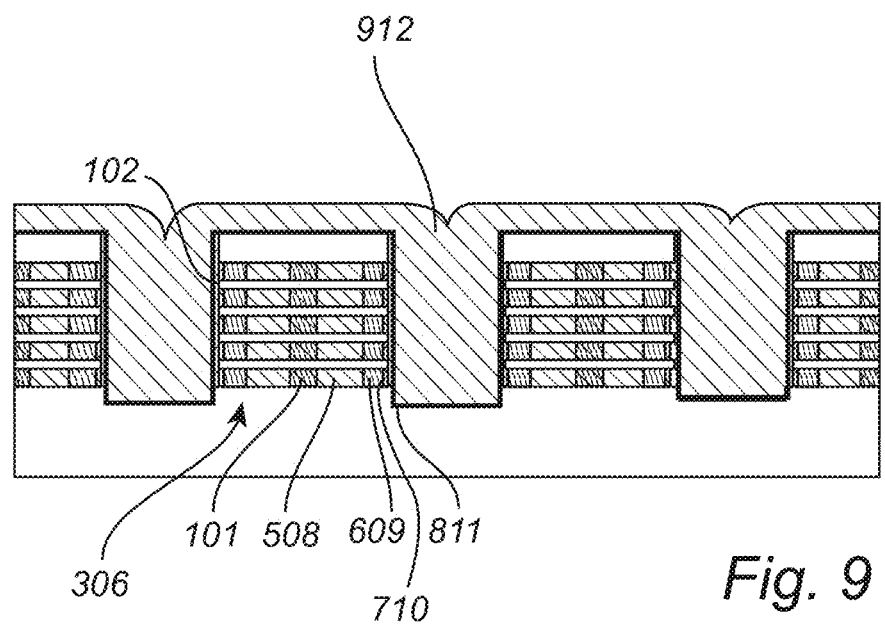

In FIG. 9, a second electrode material 912 can be provided in each one of the first trench 304 and the second trench 305. The trenches 304, 305 may be completely filled with the second electrode material 912 in some instances. This process may be performed using a deposition process, such as ALD, CVD, or a combination thereof. This second electrode 912 may form the bit line (BL) in the final semiconductor device 10. In a non-limiting example, the thickness may be about 40 nm and the material used may be any suitable material as, e.g., tungsten (W) which may reduce BL resistance.

Figure 10:
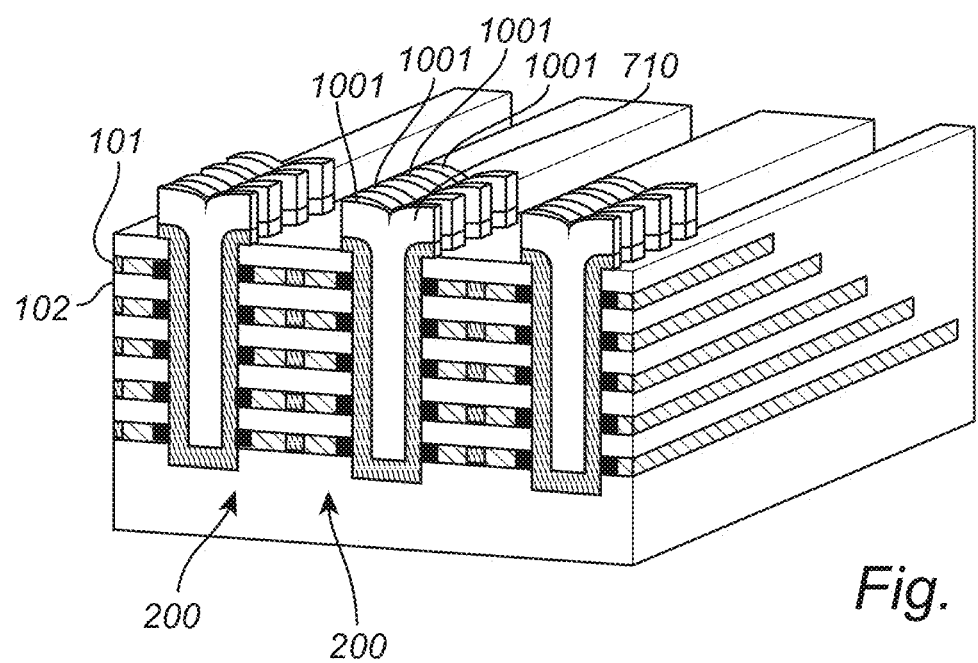
FIG. 10 illustrates a three-dimensional view of a part of a three-dimensional (3D) semiconductor memory device according to some embodiments.
Figure 11:
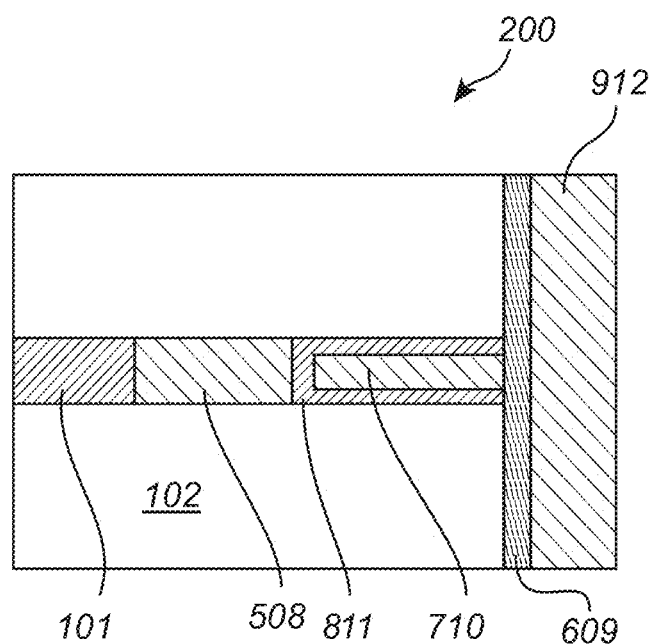
FIG. 11 illustrates a cross-sectional view of an intermediate structure as part of a method of manufacturing a three-dimensional (3D) semiconductor memory device according to some embodiments.

FIG. 10 illustrates in a three-dimensional view of a semiconductor device 10 that may be the result of a method similar to the one described above in connection with the previous embodiments. However, the disclosed example differs in that the memory element 609 (or selector element 811) may be deposited together with the middle electrode 710 as illustrated in FIG. 11. In the following, it may be understood that in some embodiments, the relative positions and the order of formation between the memory element 609 and the selector element 811 can be interchanged.

In the present example, the second electrode material 912 may be formed or patterned into a plurality of contact structures 1001, which, e.g., may extend between two or more fins (e.g., neighboring fins). The contact structures 1001 may, e.g., be formed by cutting the material, e.g., etching away certain portions of the electrode material, along the fins such that different portions of each fin may be selectively addressed. By patterning, or cutting also the selector element material and the middle electrode 710 along the fin, a plurality of individually addressable cells may be formed along each stack level of the fin. In other words, a plurality of functionally separated cells may be formed on each level of the stack 100. Adjacent cells may hence be defined, or separated from each other, by removing the selector material and the middle electrode material between the contact structures formed of the second electrode material 912. In FIG. 10, the resulting contact structures may be shaped as dots configured to connect the cell stacks arranged at both sides of a trench 304, 305 to a common bit line (BL, not shown).

As already mentioned, the lateral stack structures illustrated in FIG. 10 differ from the corresponding structures shown in the previous figures. This difference, which is an example of an alternative configuration according to some embodiments of the disclosed technology, is further illustrated in FIG. 11. Accordingly, the recess 407 may be provided with the first conductive material 508 in a similar process as described in relation to FIGS. 5a and 5b, and subsequently lined with a selector element material forming the selector element 811. The lining process differs from the above described replacement processes, in that the final thickness of the layer may be determined directly in the deposition step rather than by a subsequent etch or recess process. Each recess 407 is subsequently filled with a second conductive material forming the middle electrode 710, and the memory element 609 is formed by providing a memory element material 609 in the first trench 304 and the second trench 305 such that it extends at least partly into the lateral stack. The memory element material 609 may or may not extend into the recess 407. In the illustrated example, the memory element 609 is formed outside of the recess 407 and forms a continuous layer lining at least the sidewall surfaces of the first and second trenches 304, 305. After this lateral stack is formed, the second electrode material 912 is added, for example, such that it covers the fin and the trenches 304, 305. This alternative procedure of providing a lateral stack may provide better selector element thickness control and improved memory element definition in some embodiments.

In various embodiments disclosed herein, the memory and selector elements 609, 811 may also be formed in multiple alternating layers. This means that the processes described above can be performed multiple times depending on the number of layers. As used herein, lining can be understood as a process of covering a surface or wall with a layer of a material.

As described herein in embodiments referring to the memory 609 or selector elements 811, these features can be interchanged in their relative positions and/or the order of formation.

Figure 12A:
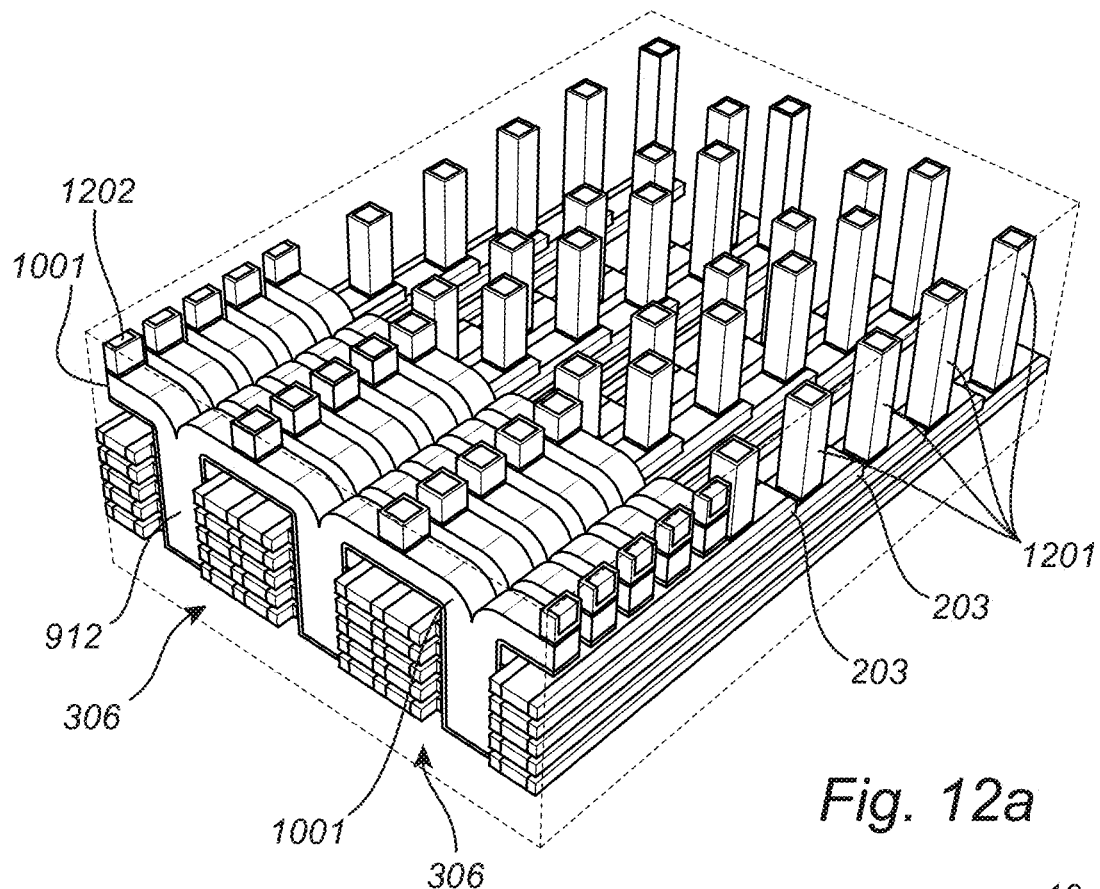
FIGS. 12a and 12b illustrate three-dimensional views of a part of a three-dimensional (3D) semiconductor memory device according to some embodiments.
Figure 12B:
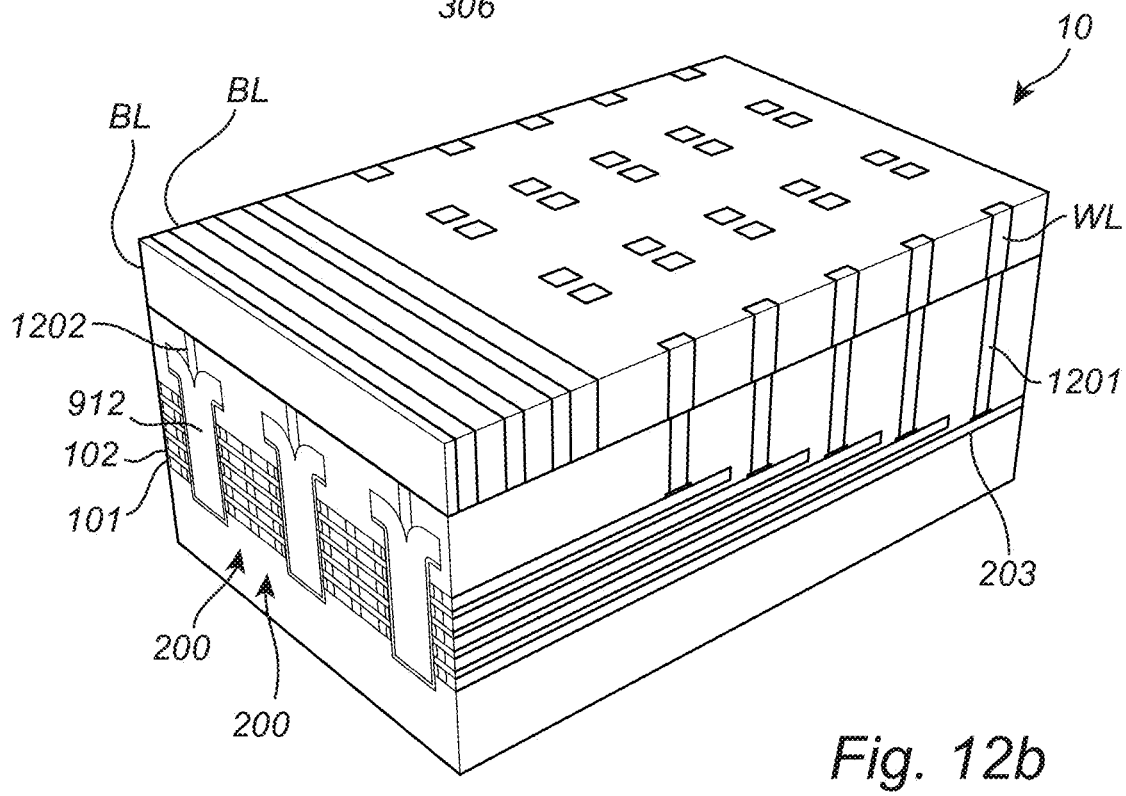

FIG. 12a illustrates a three-dimensional view of a 3D semiconductor device 10 according to an embodiment, in which the second electrode material 912 has been patterned into lines crossing the fins. The staircase contact structure 203 and the second electrode material lines 912 may be provided with contact structures 1201, 1202, such as, e.g., vertical via connections, to allow the plurality of memory device (or cells) 200 to be connected to a respective word line WL and/or bit line BL. Such a structure is illustrated in FIG. 12b.

Alternatively, after forming the trenches as explained in FIG. 3, the trenches may first be refilled with insulating material where after hole openings are formed before proceeding to the next step as explained in FIG. 4 (e.g., formation of the selector and memory elements by the different deposit and recess steps). It can have the advantage that no further patterning and lithography steps are needed as described in FIG. 12a. FIG. 12b is a perspective view of a semiconductor device 10 that may be similarly configured as the embodiments discussed above in connection with the previous figures. However, in the present example, the semiconductor device 10 can be provided with a plurality of bit lines BL and word lines WL configured to address the plurality of cells 200 of the 3D semiconductor device 10. Each bit line BL may be electrically connected to a respective second electrode 912 via the second electrode contacts 1202 and be arranged in a parallel grid crossing the fins. Further, each level of the staircase structure 203 of each fin may be connected to a respective word line WL by the vertical staircase contacts 1201. As indicated in FIG. 12b, the bit lines BL and the word lines WL may be arranged in a common layer, embedded in an insulating material in some embodiments.

It will be appreciated that, as configured, memory cells are formed on opposing sides of each the first layers 101 by depositing simultaneously in the first and second trenches 304, 305. Thus formed memory cells formed on opposing sides of each of the first layers 101 are electrically connected to separate contact structures 1201 through respective word lines, such that they are individually or independently accessible or bit-addressable. The resulting memory device 10 can have higher bit density compared to memory devices in which the memory cell stacks formed on opposing sides are not individually or independently accessible or bit-addressable.

Figures 13A, 13B:
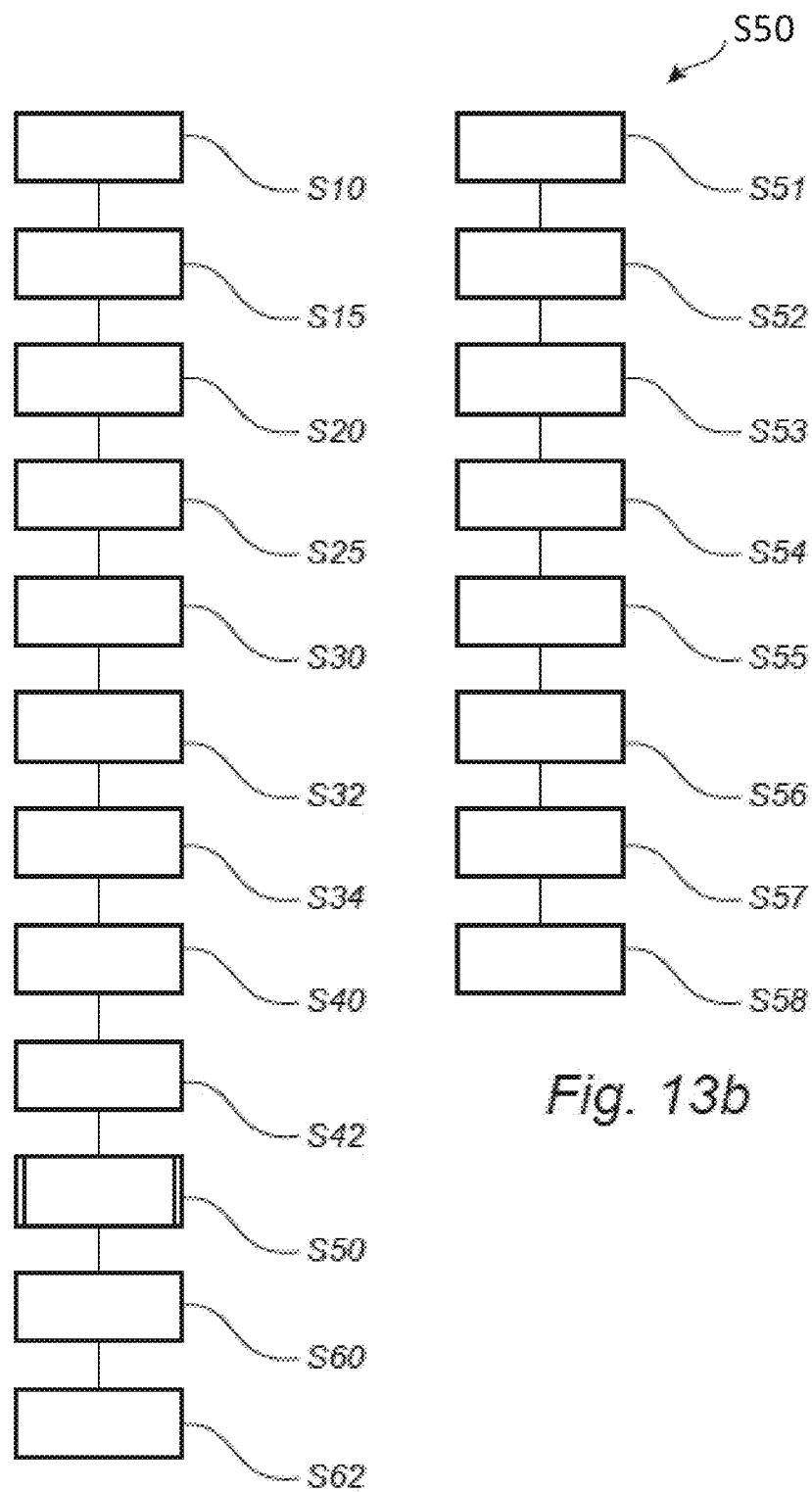
FIGS. 13a, 13b, 13c, and 13d are schematic flow charts illustrating methods according to some embodiments.

FIGS. 13a and 13b schematically outline the steps of exemplary methods to fabricate a semiconductor device 10 according to the above-described examples and embodiments.

According to FIG. 13a, the method may comprise the steps of:
  providing S10 a vertical stack of alternating layers of a first layer type and a second layer type;
  providing S15 the vertical stack with a staircase connection structure;
  forming S20 a first trench and a second trench in the vertical stack, the first trench and the second trench defining a fin;
  recessing S25, from the first trench and from the second trench, the first layer type to form recesses extending into the fin;
  providing S30 a first electrode in each recess by filling S32 each recess with a first conductive material and recessing S34 at least some of the first conductive material back into the recess;
  providing S40 a second electrode in each one of the first trench and the second trench by forming S42 a second electrode material into a plurality of contact structures;
  providing S50, for each recess, a lateral stack comprising a memory element, a middle electrode and a selector element, the lateral stack stacked in a lateral direction and extending between the first electrode and the second electrode, thereby forming a memory device;
  connecting S60, via the staircase connection structure, the first electrode in each recess to a respective word line; and
  connecting S62 each one of the plurality of contact structures to a respective bit line.

According to FIG. 13b, the step of providing S50 the lateral stack may comprise the steps of:
  forming S51 one of the memory element or the selector element by filling each recess with a memory element material or a selector element material respectively;
  recessing S52 at least some of the memory element material or the selector element material back into the recess;
  forming S53 the middle electrode by filling each recess with a second conductive material;
  recessing S54 at least some of the second conductive material back into the recess;
  forming S55 the other of the selector element or the memory element by providing the other of the selector element material or the memory element material in the first trench and the second trench;
  lining S56 each recess with one of a selector element material or a memory element material to form one of the selector element or the memory element, respectively;
  filling S57 each recess with a second conductive material forming the middle electrode; and
  forming S58 the other of the selector element or the memory element by providing the other of the selector element material or the memory element material in the first trench and the second trench.

Figure 13C:
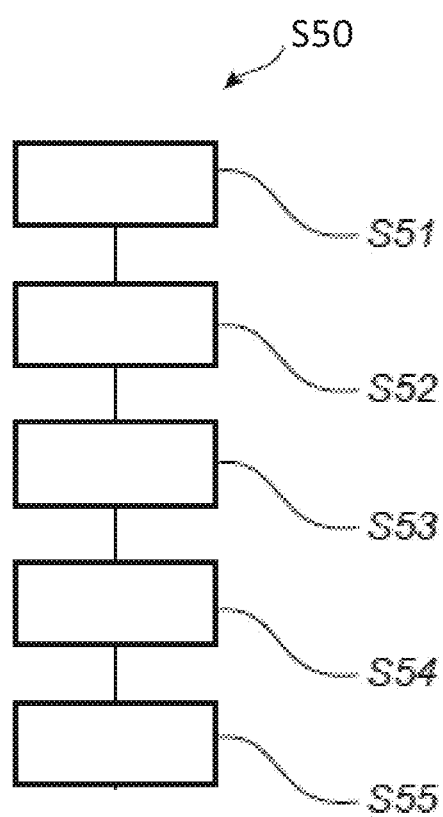

In various embodiments, some of the steps S51-S58 can be combined and used in different (e.g., alternative) implementations of the step of providing S50. For example, as illustrated in FIG. 13c, the step of providing S50 the lateral stack may comprise the steps of:
  forming S51 one of the memory element or the selector element by filling each recess with a memory element material or a selector element material respectively;

recessing S52 at least some of the memory element material or the selector element material back into the recess;

forming S53 the middle electrode by filling each recess with a second conductive material;

recessing S54 at least some of the second conductive material back into the recess; and forming S55 the other of the selector element or the memory element by providing the other of the selector element material or the memory element material in the first trench and the second trench.

Figure 13D:
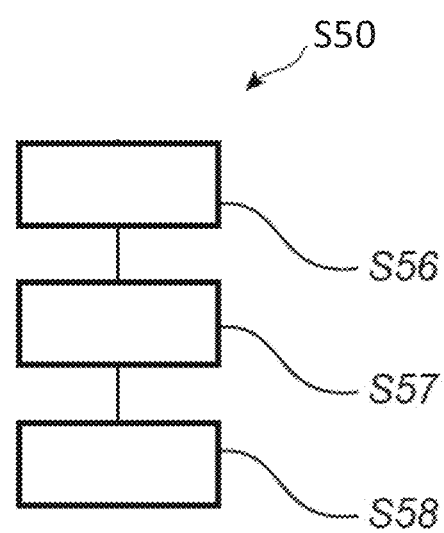

As another example, as illustrated in FIG. 13d, in some embodiments, the step of providing S50 the lateral stack may comprise the steps of:

lining S56 each recess with one of a selector element material or a memory element material to form one of the selector element or the memory element, respectively;

filling S57 each recess with a second conductive material forming the middle electrode; and forming S58 the other of the selector element or the memory element by providing the other of the selector element material or the memory element material in the first trench and the second trench.

In all the processes described in this application, the formation of the memory device has been performed using a deposition process such as ALD. Any other suitable technique may also be used, such as, e.g., chemical vapor deposition (CVD) and/or physical vapor deposition (PVD).

The materials described in connection with the above figures should merely be seen as illustrating examples. Other material combinations are also possible, such as, e.g., ruthenium (Ru), cobalt (Co), or TiN for the WL and/or the BL, which may provide advantageous electrical conductivity properties.

While methods and processes may be depicted in the drawings and/or described in a particular order, it is to be recognized that the steps need not be performed in the particular order shown or in sequential order, or that all illustrated steps be performed, to achieve desirable results. Further, the drawings may schematically depict one or more example processes in the form of a flowchart. However, other steps that are not depicted may be incorporated in the example methods and processes that are schematically illustrated. For example, one or more additional steps may be performed before, after, simultaneously, or between any of the illustrated steps. Additionally, the steps may be rearranged or reordered in other embodiments.

In the above, the inventive concept has mainly been described with reference to a limited number of examples. However, as is readily appreciated by a person skilled in the art, other examples than the ones disclosed above are equally possible within the scope of the inventive concept, as defined by the appended claims.

What is claimed is:

1. A method of manufacturing a three-dimensional semiconductor device, the method comprising:

providing a vertical stack of alternating layers of a first layer type and a second layer type;

providing a first trench and a second trench adjacent to the vertical stack, the first trench and the second trench defining a fin;

recessing the first layer type to form recesses extending into the fin;

providing a first electrode in individual ones of the recesses;

providing a second electrode in the first trench and the second trench; and providing a lateral stack comprising a memory element, a middle electrode, and a selector element, the lateral stack stacked in a lateral direction and extending between the first electrode in the individual ones of the recesses and the second electrode, thereby forming a memory device, wherein the memory element or the selector element is formed at least partly outside of the individual ones of the recesses.

2. The method according to claim 1, wherein providing the first trench and the second trench comprises forming the first trench and the second trench in the vertical stack.

3. The method according to claim 1, wherein providing the first electrode comprises:

filling the recesses with a first conductive material; and recessing at least some of the first conductive material back into the recesses.

4. The method according to claim 3, wherein providing the lateral stack comprises:

lining individual ones of the recesses with a selector element material forming the selector element;

filling individual ones of the recesses with a second conductive material forming the middle electrode; and forming the memory element by providing a memory element material in the first trench and the second trench.

5. The method according to claim 1, wherein providing the lateral stack comprises:

forming the memory element by filling the recesses with a memory element material; and recessing at least some of the memory element material back into the recesses.

6. The method according to claim 1, wherein providing the lateral stack comprises:

forming the middle electrode by filling the recesses with a second conductive material; and recessing at least some of the second conductive material back into the recesses.

7. The method according to claim 1, wherein providing the lateral stack comprises:

forming the selector element by providing a selector element material in the first trench and the second trench.

8. The method according to claim 1, wherein the first layer type comprises a first electrical insulating material and the second layer type comprises a second electrical insulating material.

9. The method according to claim 1, further comprising:

providing the vertical stack with a staircase connection structure configured to individually connect the first electrode in individual ones of the recesses of the fin.

10. The method according to claim 9, further comprising forming a second electrode material into a plurality of contact structures configured to connect the fin with a neighboring fin.

11. The method according to claim 10, wherein the contact structures are shaped as separated lines or dots.

12. The method according to claim 10, further comprising removing a selector element material between the plurality of contact structures.

13. The method according to claim 10, further comprising removing a second conductive material between the plurality of contact structures.

14. The method according to claim 10, further comprising:

connecting, via the staircase connection structure, the first electrode in individual ones of the recesses to a respective word line; and connecting individual ones of the plurality of contact structures to a respective bit line.

15. A semiconductor device comprising:
a vertical stack of alternating layers of a first layer type and a second layer type;
a fin defined by a first trench and a second trench adjacent the vertical stack;
recesses extending laterally from the first trench and the second trench, respectively, into the fin;
a first electrode in individual ones of the recesses;
a second electrode in the first trench and the second trench; and
a lateral stack comprising a memory element, a middle electrode, and a selector element, the lateral stack being arranged to extend between the first electrode in individual ones of the recesses and the second electrode, thereby forming a memory device, wherein the memory element or the selector element is formed at least partly outside of the individual ones of the recesses.

16. The semiconductor device according to claim 15, wherein the vertical stack comprises a staircase connection structure configured to individually connect the first electrode in individual ones of the recesses of the fin.

17. The semiconductor device according to claim 16, wherein the second electrode material provides a plurality of contact structures configured to connect the fin with a neighboring fin.

18. The semiconductor device according to claim 17, wherein, via the staircase connection structure, the first electrode in individual ones of the recesses is configured to connect to a respective word line, and wherein the plurality of contact structures is configured to connect to a respective bit line.

19. The semiconductor device according to claim 15, wherein the memory element and middle electrode are disposed in individual ones of the recesses, and the selector element is disposed in the first and second trenches.

20. The semiconductor device according to claim 15, wherein the selector element and middle electrode are disposed in individual ones of the recesses, and the memory element is disposed in the first and second trenches.

* * * * *